United States Patent
Lim et al.

(10) Patent No.: US 9,310,456 B2
(45) Date of Patent: Apr. 12, 2016

(54) OFFSET COMPENSATION METHOD OF CURRENT SENSOR AND MOTOR DRIVING SYSTEM

(71) Applicant: Hyundai Motor Company, Seoul (KR)

(72) Inventors: Jae-Sang Lim, Gyeonggi-do (KR); Seong Yeop Lim, Seoul (KR); Gu Bae Kang, Gyeonggi-do (KR); Ji Wan Cha, Incheon (KR)

(73) Assignee: Hyundai Motor Company, Seoul (KR)

( * ) Notice: Subject to any disclaimer, the term of this patent is extended or adjusted under 35 U.S.C. 154(b) by 112 days.

(21) Appl. No.: 14/096,592

(22) Filed: Dec. 4, 2013

(65) Prior Publication Data
US 2014/0167669 A1    Jun. 19, 2014

(30) Foreign Application Priority Data

Dec. 18, 2012  (KR) .................. 10-2012-0148603

(51) Int. Cl.
  *H02H 5/04*    (2006.01)
  *G01R 35/00*    (2006.01)
  *H02P 29/00*    (2006.01)
  *B60L 11/00*    (2006.01)
  *G01R 19/00*    (2006.01)

(52) U.S. Cl.
  CPC ............. *G01R 35/005* (2013.01); *B60L 11/00* (2013.01); *H02P 29/0088* (2013.01); *G01R 19/0092* (2013.01)

(58) Field of Classification Search
  CPC ............. G01R 19/0092; G01R 35/005; H02P 29/0088; B60L 11/00
  See application file for complete search history.

(56) References Cited

U.S. PATENT DOCUMENTS 4,207,601 A * 6/1980 Desai et al. ................ 360/78.05

FOREIGN PATENT DOCUMENTS

JP    2011-213139 A    10/2011

* cited by examiner

*Primary Examiner* — Karen Masih
(74) *Attorney, Agent, or Firm* — Mintz Levin Cohn Ferris Glovsky and Popeo, P.C.; Peter F. Corless

(57) ABSTRACT

An offset compensation method of a current sensor is provided for determining whether an offset compensation of the current sensor is abnormal, and a motor driving system includes the current sensor. The offset compensation method includes: compensating for an offset of the current sensor, and determining whether the offset compensation of the current sensor is abnormal.

12 Claims, 9 Drawing Sheets

FIG. 4

| | Normal case | Case of forcibly inputting v phase 244A |
|---|---|---|
| Current survey waveform [A] (oscilloscope) | U phase 205<br>V phase -11<br>W phase -198 | V phase 239<br>U phase 205<br>W phase -422 |
| Current of current sensor [A] | U phase 205<br>V phase -11<br>W phase -198 | U phase 205<br>V phase -11<br>W phase -198<br>W phase -244<br>V phase -244A |
| Power module estimation temperature / measured inverter temperature [°C] | Power module estimation temperature 100<br>Measured inverter temperature 29<br>25<br>Apply torque command — 3.5 second — Remove torque command | Power module estimation temperature 114<br>40<br>103 Measured inverter temperature<br>25<br>Forcibly input v phase 244A / Apply torque command — 3.5 second — Remove torque command |

OFFSET COMPENSATION METHOD OF CURRENT SENSOR AND MOTOR DRIVING SYSTEM

CROSS-REFERENCE TO RELATED APPLICATION

This application claims under 35 U.S.C. §119(a) priority to and the benefit of Korean Patent Application No. 10-2012-0148603 filed in the Korean Intellectual Property Office on Dec. 18, 2012, the entire contents of which are incorporated herein by reference.

BACKGROUND (a) Field of the Invention

The present invention relates to an offset compensation method of a current sensor and a motor driving system incorporating the same, and more particularly, to an offset compensation method of a current sensor capable of determining whether the offset compensation of the current sensor is abnormal.

(b) Description of the Related Art

Generally, a motor is used for driving an electric vehicle, a hybrid vehicle, and the like. An inverter converts a DC current into a 3-phase AC current (u phase, v phase, and w phase) and supplies the 3-phase current to the motor through a power cable, where a motor controller controls the inverter using pulse width modulation (PWM). Further, the 3-phase current is sensed by a current sensor.

The current sensor has its own offset or has an offset due to aging of the current sensor and other hardware over time. Therefore, when current does not flow by the offset compensation of the current sensor, the current measured by the current sensor needs to be 0. A control of the motor may be stabilized, fuel consumption may be reduced, and accidents may be prevented by the offset compensation of the current sensor.

The offset compensation of the current sensor is performed every time the ignition is turned on (IG on), and an average value of an output of the current sensor for a predetermined time after the IG on is obtained, where the offset is compensated using the average value. However, when there is a disturbance in the offset compensation while the average value of the output of the current sensor is obtained, the offset compensation typically is smaller or larger than a normal value. Herein, factors causing the abnormality of the offset compensation may include noise, such as external noise or internal noise, a connector fastening defect due to vibration, heat, aging, corrosion, and the like, a change of an offset value, due to aging of the current sensor, and other factors.

FIGS. 5-9 are diagrams useful for illustrating deficiencies of the related art. In particular, FIG. 5 illustrates the output of a current sensor when the offset compensation abnormality of the current sensor occurs due to external noise. FIG. 6 illustrates the output of the current sensor when there is a connector fastening defect, and FIG. 7 illustrates a 3-phase current when the motor is controlled abnormally. It may be appreciated that when the offset compensation abnormality occurs as described above, the output of the current sensor illustrated in FIGS. 5 and 6, and the 3-phase current illustrated in FIG. 7 are different from the respective outputs of the current sensor illustrated in FIG. 8 and the 3-phase current illustrated in FIG. 9, where FIGS. 8-9 reflect outputs in which an offset compensation abnormality does not occur.

As described above, when the offset compensation abnormality of the current sensor occurs, the motor current control is abnormal, and therefore current consumption is increased and a state of charge (SOC) of a high voltage battery is reduced, such that fuel consumption is reduced. Further, when the control of the motor current is performed abnormally, the motor may be impacted by noise, vibration, and harshness (NVH), such that drivability may be deteriorated. Further, a protective logic of the inverter may malfunction due to a difference between a measured current and a control current, and in severe cases, the inverter may be damaged due to overcurrent and overtemperature, such that a vehicle may be shut down.

The above information disclosed in this Background section is only for enhancement of understanding of the background of the invention and therefore it may contain information that does not form the prior art that is already known in this country to a person of ordinary skill in the art.

SUMMARY

The present invention provides an offset compensation method of a current sensor capable of improving fuel consumption and drivability and preventing accidents, and a motor driving system incorporating the same.

An exemplary embodiment of the present invention provides an offset compensation method of a current sensor arranged in a vehicle, including: compensating for an offset of a current sensor; and determining whether the offset compensation of the current sensor is abnormal.

In determining whether the offset compensation of the current sensor is abnormal, the offset compensation may be determined to be abnormal when a difference between a power module estimation temperature generated by a motor controller and a measured inverter temperature during the stopping of the vehicle is greater than or equal to a first reference.

In determining whether the offset compensation of the current sensor is abnormal, the offset compensation may be determined to be abnormal when an increased speed of a measured inverter temperature is greater than or equal to a second reference during driving of the vehicle.

The offset compensation method may further include re-compensating for the offset of the current sensor after determining whether the offset compensation of the current sensor is abnormal.

In re-compensating for the offset of the current sensor, when a predetermined frequency is greater than or equal to a reference, a warning signal may be generated to notify a user.

Another exemplary embodiment of the present invention provides a motor driving system of a vehicle, including: an inverter including a motor controller; an inverter temperature sensor that senses a temperature of the inverter; and a current sensor that senses a current of a 3-phase power cable that connects the inverter with a motor. The motor controller may include an offset compensation unit that performs an offset compensation of the current sensor and an offset compensation abnormality determination unit that determines whether the offset compensation is abnormal.

The offset compensation abnormality determination unit may determine that the offset compensation is abnormal when a difference between a generated power module estimation temperature and a measured inverter temperature during stopping of the vehicle is greater than or equal to a first reference.

The offset compensation abnormality determination unit may determine that the offset compensation is abnormal when an increased speed of a measured inverter temperature is greater than or equal to a second reference during driving of the vehicle. When the offset compensation abnormality determination unit determines that the offset compensation is abnormal, the offset compensation may be re-compensated.

The motor controller may include a warning signal generation unit that generates a warning signal when an offset re-compensation frequency is counted and is greater than or equal to a frequency reference.

According to the exemplary embodiment of the present invention, it is possible to detect the offset compensation abnormality of the current sensor that occurs in a section in which the average value of the current sensor is obtained. Therefore, the fuel consumption can be improved by normally controlling the motor current, and the noises and the vibration can be reduced by reducing the motor vibration. Further, damage to the inverter and accidental vehicle shutdown, and the like, can be prevented.

In addition, the offset compensation abnormality of the current sensor may be determined by simple factors, such as the inverter temperature, the temperature estimation value of the power module, and the like.

Therefore, the present invention can be easily applied to an existing system by changing the logic, without adding additional structure or a separate configuration.

BRIEF DESCRIPTION OF THE DRAWINGS

The following drawings are illustrated in order to refer to a description of some exemplary embodiments of the present invention, and the technical spirit of the present invention should not be construed as being limited to the accompanying drawings.

FIG. 4 is a diagram illustrating a current survey waveform, a current of the current sensor, a measured inverter temperature, and a power module estimation temperature value, in a normal case and when offset compensation abnormality of the current sensor occurs.

DETAILED DESCRIPTION OF THE EMBODIMENTS

Hereinafter, an exemplary embodiment of the present invention will be described in detail with reference to the accompanying drawings. However, the present invention is not limited to the exemplary embodiments, but may be changed to various forms.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

In general, the hybrid vehicle referred to herein is mainly driven by an engine obtaining power from fuel (gasoline) and a motor driven with electricity. An electric vehicle is driven with electricity as a power source.

Environmentally-friendly vehicles, such as hybrid vehicles and electric vehicles, include a motor, a starter-generator (for example, a hybrid starter-generator (HSG)), and an inverter for driving a motor, and the like, to control the motor to match a torque required for a vehicle. Preferably, the starter-generator simultaneously serves as a starter for starting an engine and a generator for generating voltage.

Hereinafter, a motor driving system applied to an environmentally-friendly vehicle and an offset compensation method of a current sensor will be described in detail.

Figure 1:
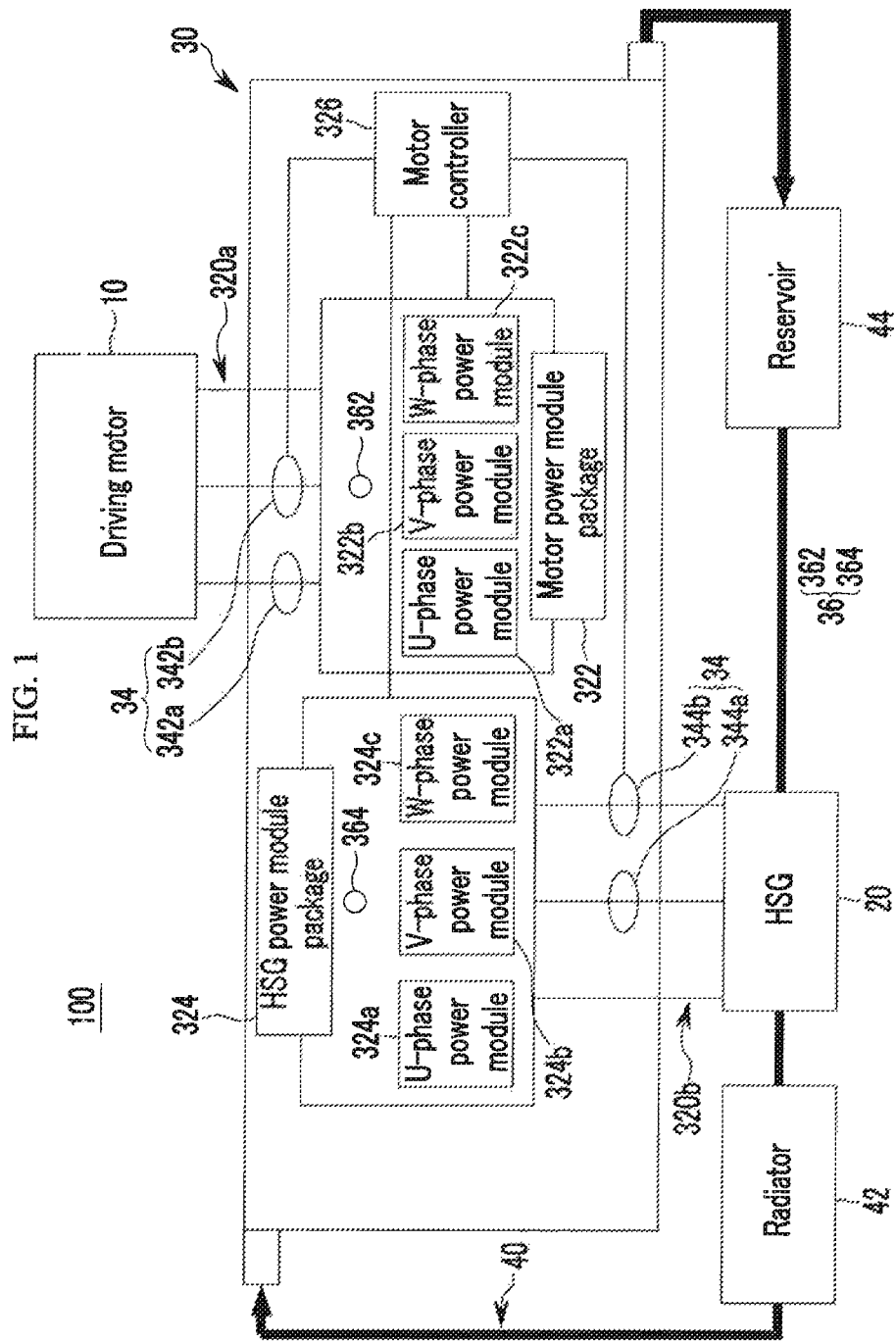
FIG. 1 is a schematic diagram illustrating a motor-inverter system including a motor driving system according to an exemplary embodiment of the present invention.
Figure 2:
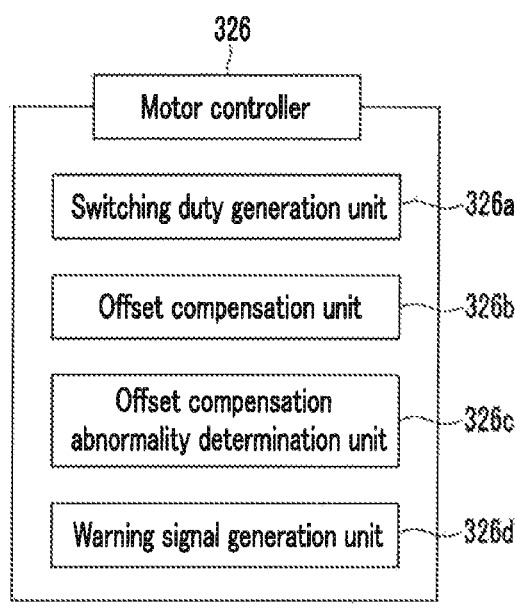
FIG. 2 is a schematic diagram illustrating a motor controller of the motor driving system of FIG. 1.

FIG. 1 is a schematic diagram illustrating a motor-inverter system including a motor driving system according to an exemplary embodiment of the present invention, and FIG. 2 is a schematic diagram illustrating a motor controller of the motor driving system of FIG. 1.

Referring to FIG. 1, a motor-inverter system 100 according to the exemplary embodiment of the present invention may include a driving motor 10, an HSG 20, and a motor driving system 30 for driving the driving motor 10 and the HSG 20. Further, the motor-inverter system 100 may include a cooling system 40 that cools the motor driving system 30. The cooling system 40 may include a radiator 42 that cools a coolant, and a reservoir 44 that removes bubbles generated during a circulation of the coolant and regulates a pressure in the radiator 42. The coolant of the cooling system 40 is cooled by the radiator 42, flows in the motor driving system 30, and again flows in the radiator 42 through the reservoir 40 and the HSG 20.

The motor driving system 30 may include an inverter 32, a current sensor 34, and an inverter temperature sensor 36. The inverter 32 includes a motor power module package 322 that is connected with the driving motor 10 by a first 3-phase power cable 320a, an HSG power module package 324 that is connected with the HSG 20 by a second 3-phase power cable 320b, and a motor controller 326 that calculates a switching duty controlling the motor power module package 322 and the HSG power module package 324.

The motor power module package 322 includes a u-phase power module 322a that controls a u-phase current of the driving motor 10, a v-phase power module 322b that controls a v-phase current of the driving motor 10, and a w-phase power module 322c that controls a w-phase current of the driving motor 10. The HSG power module package 324 includes a u-phase power module 324a that controls a u-phase current of the HSG 20, a v-phase power module 324b that controls a v-phase current of the HSG 20, and a w-phase power module 324c that controls a w-phase current of the HSG 20.

A current of the first 3-phase power cable 320a that connects the driving motor 10 with the motor power module package 322 preferably is sensed by two or three first current sensors 34, although a different number of current sensors 34 can be used. A current of the second 3-phase power cable 320b that connects the HSG 20 with the HSG power module package 324 is sensed by two or three second current sensors 34, although a different number of current sensors 34 can be used. When three current sensors 34 are used, the current sensors 34 sense the current of each of the 3-phase power cables. When two current sensors 342a and 342b are used, a current of 2-phase power cables of the 3-phase power cables is sensed by the current sensors 342a and 342b, and since a sum of current has a value of 0, the current of the remaining one power cable is calculated by the motor controller 326.

In the exemplary embodiment of the present invention, the motor power module package 322 is provided with an inverter temperature sensor 36 that senses temperature and provides the sensed temperature to the motor controller 326. The inverter temperature sensor 36 may include a first temperature sensor 362 that senses the temperature of the motor power module package 322 and provides the sensed temperature to the motor controller 326, and a second temperature sensor 364 that senses the temperature of the motor power module package 322 and provides the sensed temperature to the motor controller 326.

The exemplary embodiment of the present invention illustrates that both of the driving motor 10 and the HSG 20 each of which includes the inverter temperature sensor 36 are included. However, the present invention is not limited thereto. Therefore, various modifications in which the HSG 20 is not included or the inverter temperature sensor 36 is included in any one of the driving motor 10 and the HSG 20 may be made.

The motor controller 326 serves to control a motor, such as generating a switching duty driving the driving motor 10 and the HSG 20 and performing offset compensation. The motor controller 326 will be described in detail with reference to FIG. 2.

The motor controller 326 may include a switching duty generation unit 326a, an offset compensation unit 326b, an offset compensation abnormality determination unit 326c, and a warning signal generation unit 326d.

The switching duty generation unit 326a generates a switching duty supplying a predetermined current to the driving motor 10 and the HSG 20 according to a torque, and provides the generated switching duty to each power module package 322 and 324. Therefore, the driving motor 10 and the HSG 20 are controlled.

The offset compensation unit 326b compensates for or re-compensates for the offset of the current sensor 34. The offset compensation or the re-compensation obtains an average value of the output of the current sensor 34 for a predetermined time and is performed by updating the average value.

The offset compensation abnormality determination unit 326c generates a power module estimation temperature from a heat model based on temperature and current, where the temperature is measured by the inverter temperature sensor 36 and the current is measured by the current sensor 34. In addition, it is determined whether the offset compensation of the current sensor 34 is abnormal, by using the generated power module estimation temperature and/or the inverter temperature measured by the temperature inverter temperature sensor 36. A method for determining whether the offset compensation is abnormal will be described below in detail with reference to FIG. 3. In addition, the offset compensation abnormality determination unit 326c informs the offset compensation unit 326b of when it is determined that the offset compensation is abnormal, in order to perform offset re-compensation.

The warning signal generation unit 326d counts an offset re-compensation frequency and generates a warning signal when the offset recompensation frequency is greater than or equal to a predetermined reference frequency. The warning signal displays the necessity of maintenance to a user. For example, the user may be notified of the warning signal by using a cluster maintenance warning lamp.

Figure 3:
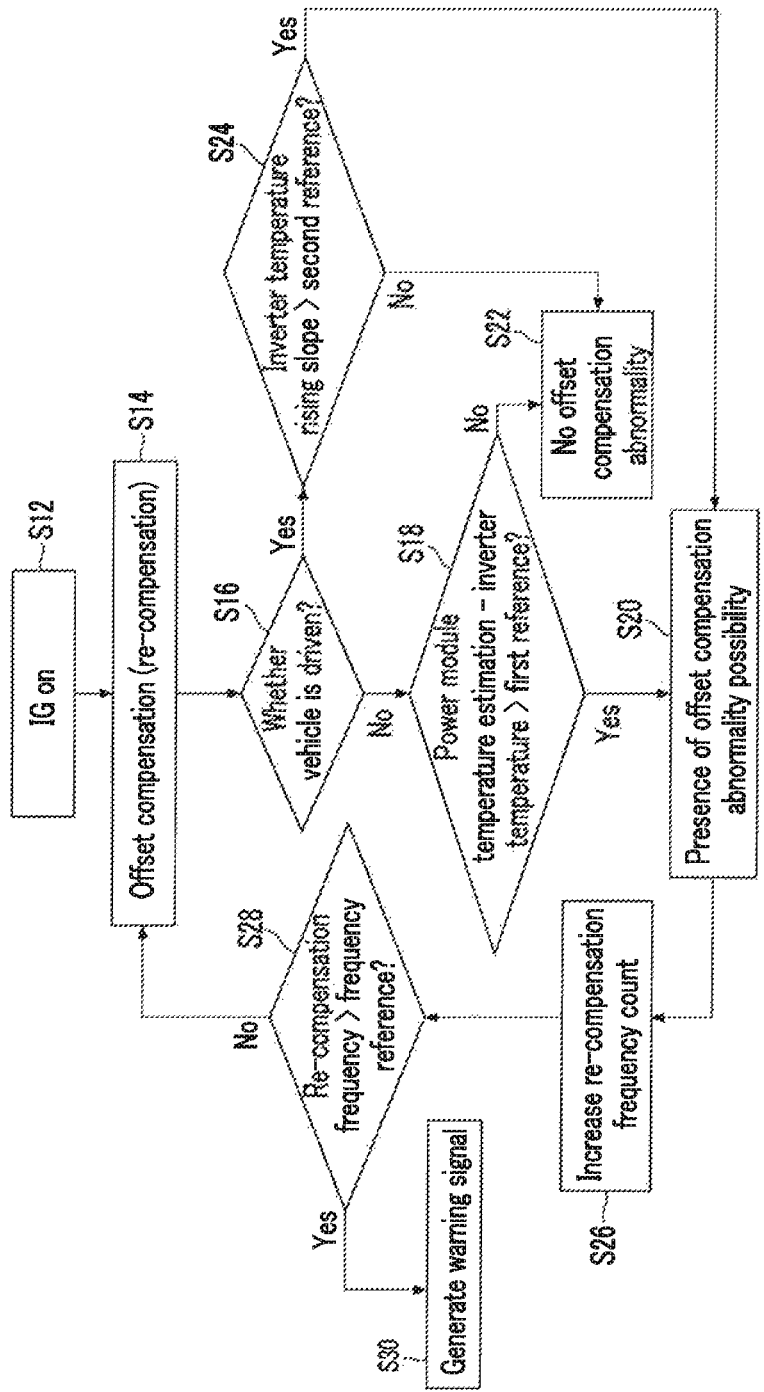
FIG. 3 is a flow chart illustrating an offset compensation method of a current sensor according to the exemplary embodiment of the present invention.
Figure 5:
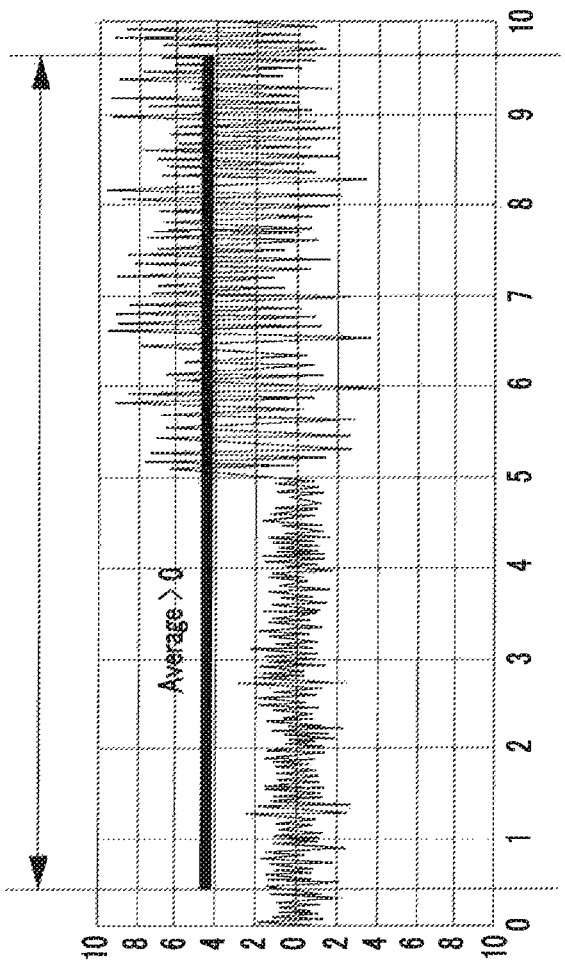
FIG. 5 (RELATED ART) is a diagram illustrating an output of the current sensor when the offset compensation abnormality of the current sensor occurs due to external noises.
Figure 6:
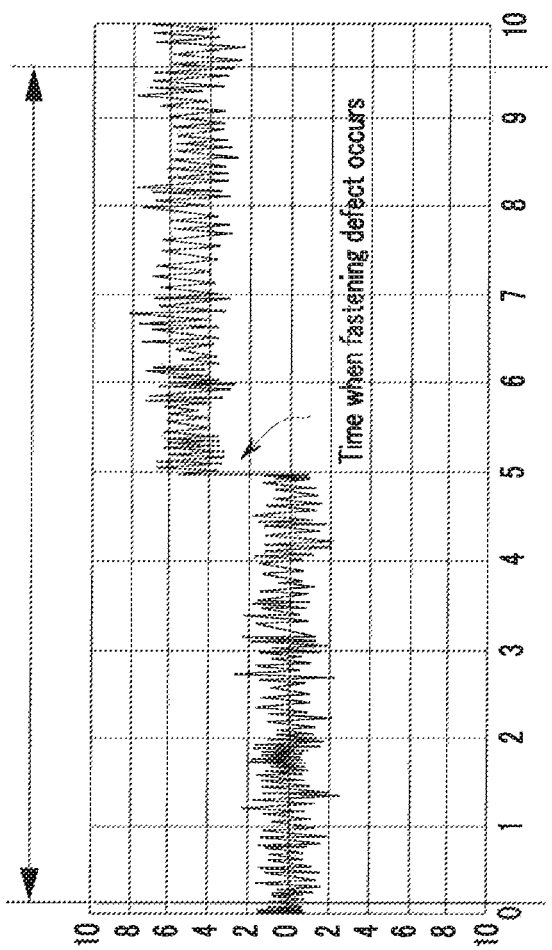
FIG. 6 (RELATED ART) is a diagram illustrating the output of the current sensor when there is a connector fastening defect.
Figure 7:
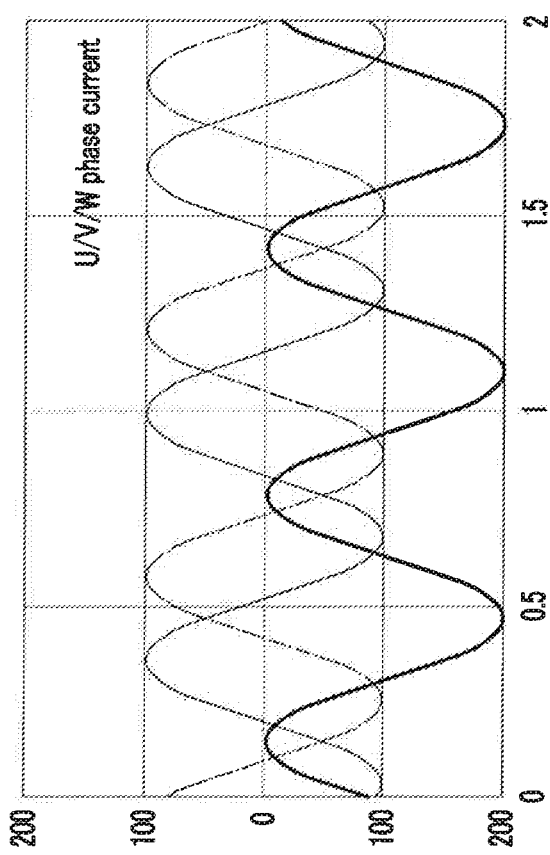
FIG. 7 (RELATED ART) illustrates a 3-phase current when a motor is controlled abnormally.
Figure 8:
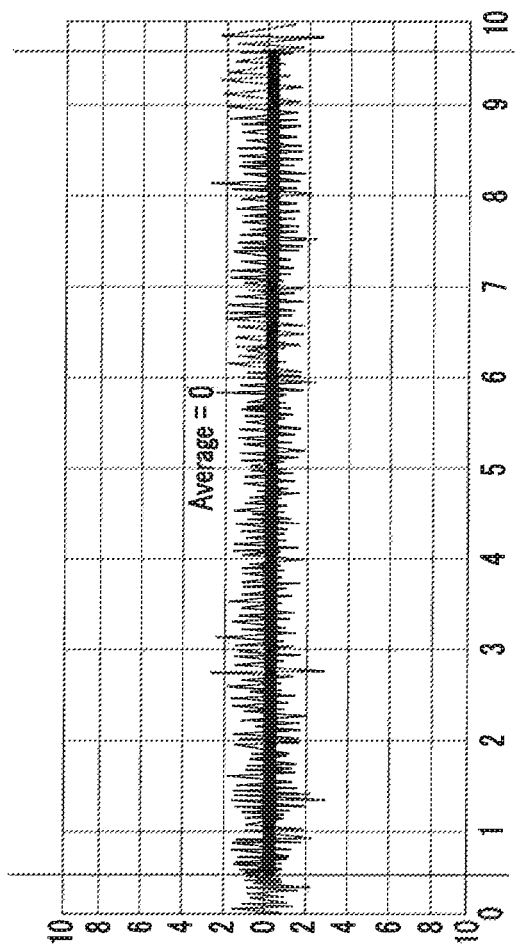
FIG. 8 (RELATED ART) is a diagram illustrating the output of the current sensor when the offset compensation abnormality of the current sensor does not occur.
Figure 9:
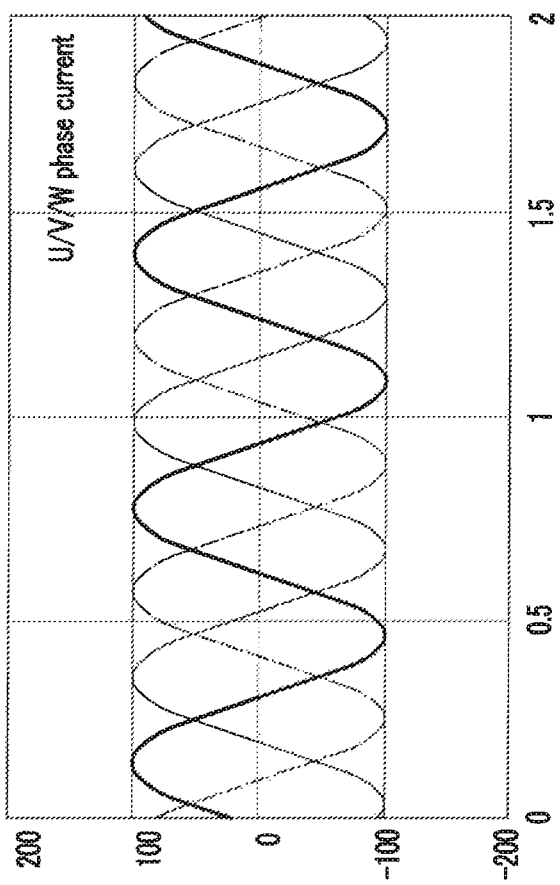
FIG. 9 (RELATED ART) is a diagram illustrating the 3-phase current when the offset compensation abnormality of the current sensor does not occur.

The offset compensation method of the current sensor using the motor driving system will be described in more detail with reference to FIG. 3. FIG. 3 is a flow chart illustrating an offset compensation method of a current sensor according to an exemplary embodiment of the present invention. First, the ignition is turned on (IG on is performed) (S12). Next, the average value of the current of the u phase, the v phase, and the w phase by the current sensor 34 for a predetermined time is calculated, and the offset of the current sensor 34 is compensated by the offset compensation unit 326b (S14).

Next, it is determined whether a vehicle is driven (S16). Whether the vehicle is driven may be determined by various methods. For example, when a speed command and a torque command of the motor are 0, it is determined that the vehicle stops, and when the speed command and the torque command of the motor are not 0, it is determined that the vehicle is driven.

The offset compensation abnormality determination unit 326c compares the power module estimation temperature with the measured inverter temperature value during the stopping of the vehicle to determine whether the offset compensation is abnormal (S18). In detail, when the difference between the power module estimation temperature and the measured inverter temperature is greater than or equal to a first reference, it is determined that there may be an offset compensation abnormality (S20) and when the difference is below the first reference, it is determined that there is no offset compensation abnormality (S22), in this case, the first reference is a value derived by experimentally calculating a range of the normally occurring temperature difference in consideration of the amount of coolant, which may vary in some cases.

When the vehicle is driven, the offset compensation abnormality determination unit 326c determines whether the offset is abnormal by using an increased speed (or slope) of the measured inverter temperature (S24). The difference between the measured inverter temperature and the power module estimation temperature may occur since current actually flows during the driving of the vehicle, such that the offset abnormality may not be determined by the foregoing first reference. Instead, when the increased speed of the measured inverter temperature is greater than or equal to a predetermined second reference, it may be determined that the abnormal current flows and therefore the temperature is increased. In this case, the second reference is a value derived by experimentally calculating the range of the increased speed of the inverter temperature normally occurring during the driving, which may vary in some cases. When the increased speed of the measured inverter temperature is greater than or equal to the second reference, it is determined that there may be the offset compensation abnormality (S20) and when the increased speed thereof is below the second reference, it is determined that there is no offset compensation abnormality (S22).

When it is determined that there may be the offset compensation abnormality (S20), the re-compensation frequency count is increased (S26). It is determined whether the re-compensation frequency is larger than a predetermined frequency reference (S28). When the re-compensation frequency is smaller than the predetermined frequency reference, the offset is re-compensated by the offset compensation unit 326b (S14), and when the re-compensation frequency exceeds the predetermined frequency, the warning signal generation unit 326d generates the warning signal to inform a user thereof (S30). The predetermined frequency reference may be set to a preferable frequency by a person having ordinary skill in the art to which the present invention pertains.

According to the exemplary embodiment of the present invention, it is possible to detect the offset compensation abnormality of the current sensor that occurs in the section in which the average value of the current sensor is obtained. Therefore, fuel consumption can be improved by normally controlling the motor current, and noise and vibration can be reduced by reducing the motor vibration. Further, the damage of the inverter and accidental vehicle shutdown can be prevented.

In addition, the offset compensation abnormality of the current sensor may be determined by simple factors, such as the inverter temperature, the temperature estimation value of the power module, and the like. Therefore, the present invention can be easily applied to an existing system by changing the logic, without adding additional structure or a separate configuration.

Further, when it is determined that there may be the offset compensation abnormality due to a temporary noise, the offset is re-compensated to normally drive the system. Therefore, the 3-phase current supplied to the driving motor 10 may be normally controlled. When it may be considered that the re-compensation frequency exceeds the predetermined frequency reference and therefore there is a problem in terms of hardware, the warning signal informs a driver of the maintenance necessity. Therefore, the phenomenon that the vehicle is continuously driven in an abnormal state, and therefore the power module is damaged or the vehicle is shut down may be prevented.

Hereinafter, the present invention will be described in more detail with reference to Experimental Example of the present invention. The following Experimental Example is proposed only to illustrate the present invention, and therefore the present invention is not limited thereto.

FIG. 4 is a diagram illustrating a current survey waveform, the current of the current sensor, the measured inverter temperature, and the power module estimation temperature value, in a normal case and in a case in which the offset compensation abnormality of the current sensor occurs. First, the normal case will be described.

The current survey waveform and the current of the current sensor have the same value in the state in which the vehicle stops before the torque command is input. Both of the power module estimation temperature and the measured inverter temperature have the same value of 25° C. Therefore, the difference between the power module estimation temperature and the measured inverter temperature is 0, such that it may be determined that there is no offset compensation abnormality of the current sensor.

The torque command was applied for 3.5 seconds and then was removed. The measured inverter temperature is increased from 25° C. to 29° C. for 3.5 seconds in the driving state in which the torque command is applied. Therefore, the increased speed of the inverter temperature has a low numerical value as 1.2° C./sec and when the numerical value is lower than the second reference, it may be determined that there is no offset compensation abnormality.

Next, the case in which an offset of 244 A is input to the v phase will be described. When the offset of 244 A is input to the v phase in the state in which the vehicle stops before the torque command is input, in the current sensor, the v phase is recognized as −244 A and the w phase is actually 0 A but is recognized as 244 A. The estimation temperature of the power module is 103° C. and the measured inverter temperature is 25° C. Therefore, the difference between the power module estimation temperature and the measured inverter temperature reaches 78° C. When the difference value is larger than the first reference, it is determined that there is the offset compensation abnormality of the current sensor.

The torque command was applied for 3.5 seconds and then was removed. The measured inverter temperature is increased from 25° C. to 40° C. for 3.5 seconds in the driving state in which the torque command is applied. Therefore, the increased speed of the inverter temperature is 4.3° C./sec and when the numerical value is larger than the second reference, it may be determined that there is offset compensation abnormality.

In this case, when the offset re-compensation depends on the temporary noise, the offset re-compensation is performed and then the normal driving is performed. However, as described above, when it is considered that the offset re-compensation exceeds the predetermined frequency reference, and therefore a problem in terms of hardware occurs, the warning signal is issued and the maintenance may be performed.

As described above, in the present invention, it may be accurately and rapidly determined whether the offset compensation of the current sensor is abnormal by using the difference between the power module estimation temperature and the measured inverter temperature and/or the increased speed of the inverter temperature.

The features, structures, effects, and the like, as described above are included in at least one exemplary embodiment of the present invention and are not construed as being limited only to one exemplary embodiment. Further, the features, structures, and effects, and the like, illustrated in each exemplary embodiment may be combined and modified with and to other exemplary embodiments by a person having ordinary skill in the art to which the present invention pertains. Therefore, it should be construed that contents associated with the combination and modification thereof are included in the scope of the present invention.

What is claimed is:

1. An offset compensation method of a current sensor arranged in a vehicle, comprising the steps of:
   compensating for an offset of the current sensor; and
   determining whether the offset compensation of the current sensor is abnormal,
   wherein in the step of determining whether the offset compensation of the current sensor is abnormal, the offset compensation is determined to be abnormal when a difference between a power module estimation temperature generated by a motor controller and a measured inverter temperature during stopping of the vehicle is greater than or equal to a first reference.

2. The offset compensation method of claim 1, further comprising:
after the step of determining whether the offset compensation of the current sensor is abnormal,
re-compensating for the offset of the current sensor.

3. The offset compensation method of claim 2, wherein:
in the re-compensating step, when a re-compensation frequency is greater than or equal to a predetermined frequency reference, generating a warning signal to notify a user of the warning signal.

4. A motor driving system of a vehicle, comprising:
an inverter including a motor controller;
an inverter temperature sensor that senses a temperature of the inverter; and
a current sensor that senses a current of a 3-phase power cable that connects the inverter with a motor,
wherein the motor controller includes an offset compensation unit that performs an offset compensation of the current sensor, and an offset compensation abnormality determination unit that determines whether the offset compensation is abnormal, and
the offset compensation abnormality determination unit determines that the offset compensation is abnormal when a difference between a generated power module estimation temperature and a measured inverter temperature during stopping of the vehicle is greater than or equal to a first reference.

5. The motor driving system of claim 4, wherein:
when the offset compensation abnormality determination unit determines that the offset compensation is abnormal, the offset compensation is re-compensated.

6. The motor driving system of claim 4, wherein:
the motor controller includes a warning signal generation unit that generates a warning signal when an offset re-compensation frequency is counted and is greater than or equal to a predetermined frequency reference.

7. An offset compensation method of a current sensor arranged in a vehicle, comprising the steps of:
compensating for an offset of the current sensor; and
determining whether the offset compensation of the current sensor is abnormal,
wherein in the step of determining whether the offset compensation of the current sensor is abnormal, the offset compensation is determined to be abnormal when an increased speed of a measured inverter temperature is greater than or equal to a second reference during driving of the vehicle.

8. The offset compensation method of claim 7, further comprising:
after the step of determining whether the offset compensation of the current sensor is abnormal,
re-compensating for the offset of the current sensor.

9. The offset compensation method of claim 8, wherein:
in the re-compensating step, when a re-compensation frequency is greater than or equal to a predetermined frequency reference, generating a warning signal to notify a user of the warning signal.

10. A motor driving system of a vehicle, comprising:
an inverter including a motor controller;
an inverter temperature sensor that senses a temperature of the inverter; and
a current sensor that senses a current of a 3-phase power cable that connects the inverter with a motor,
wherein the motor controller includes an offset compensation unit that performs an offset compensation of the current sensor, and an offset compensation abnormality determination unit that determines whether the offset compensation is abnormal, and
the offset compensation abnormality determination unit determines that the offset compensation is abnormal when an increased speed of a measured inverter temperature is greater than or equal to a second reference during driving of the vehicle.

11. The motor driving system of claim 10, wherein:
when the offset compensation abnormality determination unit determines that the offset compensation is abnormal, the offset compensation is re-compensated.

12. The motor driving system of claim 10, wherein:
the motor controller includes a warning signal generation unit that generates a warning signal when an offset re-compensation frequency is counted and is greater than or equal to a predetermined frequency reference.

* * * * *